US012318805B2

(12) United States Patent
McGraw et al.

(10) Patent No.: US 12,318,805 B2
(45) Date of Patent: Jun. 3, 2025

(54) ORGANIC VAPOR JET PRINT HEAD WITH ORTHOGONAL DELIVERY AND EXHAUST CHANNELS

(71) Applicant: Universal Display Corporation, Ewing, NJ (US)

(72) Inventors: Gregory McGraw, Yardley, PA (US); William E. Quinn, Whitehouse Station, NJ (US); Matthew King, Moorestown, NJ (US)

(73) Assignee: Universal Display Corporation, Ewing, NJ (US)

( * ) Notice: Subject to any disclaimer, the term of this patent is extended or adjusted under 35 U.S.C. 154(b) by 757 days.

(21) Appl. No.: 17/322,949

(22) Filed: May 18, 2021

(65) Prior Publication Data
US 2021/0268536 A1    Sep. 2, 2021

Related U.S. Application Data

(62) Division of application No. 16/254,998, filed on Jan. 23, 2019, now Pat. No. 11,033,924.
(Continued)

(51) Int. Cl.
*B05C 5/02*    (2006.01)
*B05B 7/00*    (2006.01)
(Continued)

(52) U.S. Cl.
CPC ............ *B05C 5/027* (2013.01); *B05B 7/0075* (2013.01); *B05C 5/0212* (2013.01); *B41J 2/1626* (2013.01);
(Continued)

(58) Field of Classification Search
CPC ..... B05C 5/027; B05C 5/0212; B05B 7/0075; B81B 2201/052; Y10T 29/49401
(Continued)

(56) References Cited

U.S. PATENT DOCUMENTS

| 4,769,292 A | 9/1988 | Tang |
| 5,247,190 A | 9/1993 | Friend |

(Continued)

FOREIGN PATENT DOCUMENTS

| CN | 102851648 A | 1/2013 |
| CN | 105316623 A | 2/2016 |

(Continued)

OTHER PUBLICATIONS

Korean Office Action (including partial English translation) issued in App. No. KR1020190013046, dated Jun. 28, 2023, 8 pages.
(Continued)

*Primary Examiner* — Thiem D Phan
(74) *Attorney, Agent, or Firm* — Butzel Long

(57) ABSTRACT

Embodiments of the disclosed subject matter provide a device that may have a first depositor that includes one or more delivery apertures surrounded by one or more exhaust apertures, where the one or more delivery apertures and the one or more exhaust apertures are enclosed within a perimeter of a boss that protrudes from a substrate-facing side of the one or more delivery apertures. The delivery channels for the one or more delivery apertures and exhaust channels for the one or more exhaust apertures may be routed orthogonally to each other. The one or more delivery apertures may be configured to permit jets of delivery gas pass through a lower surface of the first depositor. The lower surface of the first depositor may include the one or more exhaust apertures to remove surplus vapor from a delivery zone. Embodiments may also provide a method of forming a print head.

5 Claims, 14 Drawing Sheets

Related U.S. Application Data

(60) Provisional application No. 62/624,184, filed on Jan. 31, 2018.

(51) Int. Cl.
  *B41J 2/16*      (2006.01)
  *G03F 7/00*      (2006.01)
  *H10K 71/18*     (2023.01)
  *H10K 50/11*     (2023.01)
  *H10K 71/10*     (2023.01)
  *H10K 101/30*    (2023.01)
  *H10K 101/40*    (2023.01)

(52) U.S. Cl.
  CPC .......... *B41J 2/1631* (2013.01); *G03F 7/0015* (2013.01); *H10K 71/18* (2023.02); *H10K 50/11* (2023.02); *H10K 71/10* (2023.02); *H10K 2101/30* (2023.02); *H10K 2101/40* (2023.02); *Y10T 29/49401* (2015.01)

(58) Field of Classification Search
  USPC ............. 29/890.1, 890.11, 890.126, 890.142
  See application file for complete search history.

(56) References Cited

U.S. PATENT DOCUMENTS

| | | |
|---|---|---|
| 5,703,436 A | 12/1997 | Forrest |
| 5,707,745 A | 1/1998 | Forrest |
| 5,834,893 A | 11/1998 | Bulovic |
| 5,844,363 A | 12/1998 | Gu |
| 6,013,982 A | 1/2000 | Thompson |
| 6,087,196 A | 7/2000 | Sturm |
| 6,091,195 A | 7/2000 | Forrest |
| 6,097,147 A | 8/2000 | Baldo |
| 6,294,398 B1 | 9/2001 | Kim |
| 6,303,238 B1 | 10/2001 | Thompson |
| 6,337,102 B1 | 1/2002 | Forrest |
| 6,468,819 B1 | 10/2002 | Kim |
| 7,279,704 B2 | 10/2007 | Walters |
| 7,431,968 B1 | 10/2008 | Shtein |
| 7,968,146 B2 | 6/2011 | Wagner |
| 9,583,707 B2 | 2/2017 | Quinn |
| 10,391,768 B2 * | 8/2019 | Reinten ................. B41J 2/1628 |
| 2003/0230980 A1 | 12/2003 | Forrest |
| 2004/0174116 A1 | 9/2004 | Lu |
| 2005/0160984 A1 | 7/2005 | Schmitt |
| 2008/0152806 A1 | 6/2008 | Forrest |
| 2013/0005057 A1 | 1/2013 | Kim |
| 2013/0208036 A1 | 8/2013 | Forrest |
| 2014/0235012 A1 | 8/2014 | McGraw |
| 2015/0376787 A1 | 12/2015 | McGraw |
| 2015/0380648 A1 | 12/2015 | McGraw |
| 2016/0083845 A1 | 3/2016 | Quinn |
| 2017/0229663 A1 | 8/2017 | Tsai |
| 2019/0232325 A1 | 8/2019 | McGraw |

FOREIGN PATENT DOCUMENTS

| | | |
|---|---|---|
| EP | 3533610 A1 | 9/2019 |
| KR | 20140064679 | 5/2014 |
| KR | 20160000861 | 1/2016 |
| KR | 20160122862 | 10/2016 |
| WO | 2008057394 A1 | 5/2008 |
| WO | 2010011390 A2 | 1/2010 |

OTHER PUBLICATIONS

Baldo et al. Highly efficient phosphorescent emission from organic electroluminescent devices, Nature, vol. 395, pp. 151-154, 1998.

Baldo, et al., "Very high-efficiency green organic light-emitting devices based on electrophosphorescence", Applied Physics Letters, Jul. 5, 1999, 4 pp., vol. 75, No. 1, American Institute of Physics, Melville, NY, USA.

Deen et al., "Transport Phenomena", pp. 14-20.

Extended European Search Report for Application No. EP19154844.5, dated Aug. 7, 2019, 7 pages.

Chinese Office Action for App. No. CN201910101146.8, dated Jan. 5, 2021, 6 pages.

Partial European Search Report issued in App. No. EP22193239, dated Dec. 5, 2022, 11 pages.

\* cited by examiner

ORGANIC VAPOR JET PRINT HEAD WITH ORTHOGONAL DELIVERY AND EXHAUST CHANNELS

CROSS-REFERENCE TO RELATED APPLICATIONS

This application is a divisional application of U.S. patent application Ser. No. 16/254,998, filed on Jan. 23, 2019, which claims priority to U.S. Patent Application Ser. No. 62/624,184, filed Jan. 31, 2018, the entire contents of each are incorporated herein by reference.

FIELD

The present invention relates to an organic vapor jet print head, having delivery channels and exhaust channels that are orthogonal to one another.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Alternatively the OLED can be designed to emit white light. In conventional liquid crystal displays emission from a white backlight is filtered using absorption filters to produce red, green and blue emission. The same technique can also be used with OLEDs. The white OLED can be either a single EML device or a stack structure. Color may be measured using CIE coordinates, which are well known to the art.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY

According to an embodiment, an organic light emitting diode/device (OLED) is also provided. The OLED can include an anode, a cathode, and an organic layer, disposed between the anode and the cathode. According to an embodiment, the organic light emitting device is incorporated into one or more device selected from a consumer product, an electronic component module, and/or a lighting panel.

According to an embodiment, a device may have a first depositor that includes one or more delivery apertures surrounded by one or more exhaust apertures, where the one or more delivery apertures and the one or more exhaust apertures are enclosed within a perimeter of a boss that protrudes from a substrate-facing side of the one or more delivery apertures. The delivery channels for the one or more delivery apertures and exhaust channels for the one or more exhaust apertures may be routed orthogonally to each other. The one or more delivery apertures may be configured to permit jets of delivery gas pass through a lower surface of the first depositor. The lower surface of the first depositor may include the one or more exhaust apertures to remove surplus vapor from a delivery zone.

The one or more exhaust apertures of the device may be a single oval exhaust aperture. The single oval exhaust may be formed using a SOI (silicon-on-insulator) dissolved wafer process disclosed herein. The device may include a second depositor, where each of the first and second depositors is enclosed within its own boss or is arranged on a common boss. The first depositor and the second depositor may be arranged in different ranks, and a printing pitch may be defined by the shortest distance orthogonal to a print direction between centers of the first and second depositors.

The exhaust channels of the device may be in a plane of the one or more delivery apertures, and the delivery channels may be enclosed within pillars normal to the plane of the one or more delivery apertures that extend through the exhaust channel layer. The delivery channels may receive delivery gas to provide to the one or more delivery apertures, and the delivery channel may include a plurality of sub-channels through a lower surface of the first depositor that each feed a different delivery aperture of the one or more delivery apertures. At least one delivery via may be disposed at an opposite end of the delivery channels from the one or more delivery apertures, where the at least one delivery via may receive delivery gas for the first depositor.

The process gas may be drawn through the one or more exhaust apertures and exits through the exhaust channels of the device. The confinement gas may be distributed via a recess disposed adjacent to the boss of the first depositor. The exhaust channels of the device may form continuous cavities that are separated by walls. An arrangement of the exhaust channels may be parallel to a print direction, and/or may have an annular ring arrangement. A shape of the one or more delivery apertures may be circular apertures or slit apertures. Jets from the circular apertures diverge in all directions in a substrate plane when impinged on a substrate or diverge in orthonormal directions, and the jets from the slit apertures diverge in directions orthonormal to a substrate normal and a major axis of a slit of the slit apertures.

The device may include confinement apertures with planes parallel to a substrate plane, where the confinement apertures are positioned on the deposition bosses. The confinement channels of the device may be interdigitated with the exhaust channels. The first depositor and other depositors may be arranged in banks, where each bank deposits a different emissive layer composition to produce a different color of an organic light emitting device. The banks may be offset from each other along a print direction by a subpixel separation for each color.

According to an embodiment, a method of forming a print head may include forming an upper portion of a micronozzle array on a first side of a double side polished (DSP) silicon wafer, covering a first surface of the DSP silicon wafer with a photolithography patterned mask, etching blind holes into the first surface of the DSP silicon wafer using deep reactive ion etching (DRIE) to form delivery vias and delivery channels of the micronozzle array, and etching a second side of the DSP silicon wafer using a nested mask that is patterned with photolithography to form exhaust channels and internal pillars. The silicon wafer may be approximately 500 µm in thickness.

The upstream portions of the delivery channels may be formed so as to be wider than a downstream portions of the delivery channels. The upstream portions and the downstream portions of the delivery channels may be formed using a nested mask and a two-stage etch. A total etch depth of the two-stage etch for the delivery via and the delivery channels may be 400-450 µm. The etching the second side of the DSP silicon wafer may be performed in two stages, which include etching a lower surface to a depth of 200-300 µm to define the exhaust channels and the internal pillars of the micronozzle array, where each pillar surrounds a delivery channel and separates it from a surrounding exhaust channel, and etching an opening over a face of the internal pillars to create a through hole for the delivery channels. A lower portion of the micronozzle array may be defined in a silicon-on-insulator (SOI) wafer. The SOI wafer may have a thickness of 100 µm.

The method may include masking a device layer and patterning the device layer with photolithography, etching the device layer through approximately two-thirds of its thickness with DRIE to form an elliptical trench to form part of the exhaust channels, and forming a central rectangular trench to be part of the delivery channels. The method may include joining a handle to a device layer by an oxide layer, where the handle provides mechanical support for the device layer during processing. The method may include bonding the DSP and SOI wafers, where a joint connects the faces of the pillars on the DSP wafer to the ridges of the SOI wafers to form a seal that separates the delivery channels and the exhaust channels into distinct flow paths. The method may include removing the handle layer, patterning a nested etch mask on the underside of the device layer using photolithography, and etching the underside of the wafer. The etching may include etching to define raised regions on the underside of the micronozzle array and the exhaust apertures, and etching to define and open the delivery apertures by removing portions of a silicon membrane covering a central trench leading to the delivery channels. The delivery apertures may be defined by direct photolithography patterning, followed by etching through a shallow membrane.

The method may include connecting exhaust apertures to the exhaust channels through a dogleg structure, where an upper portion of the dogleg is formed by elliptical trench etched on a SOI wafer, and a lower portion of the dogleg is formed by the nested etch on the underside of a SOI device layer. The method may include metallizing an exposed portion of the DSP silicon wafer face after etching, forming a film stack that includes an adhesion layer, a diffusion blocking layer, and a capping layer, and separating the micronozzle arrays by dicing the DSP silicon wafer. The method may include forming a seal between the micronozzle array and a manifold, where the manifold may provide the micronozzle array with delivery gas having organic vapor, and that withdraws a stream of exhaust gasses from the exhaust channels. The method may include forming a joint between the DSP silicon wafer and a face of a carrier plate, where the delivery vias and exhaust vias on the DSP silicon wafer match ports of the carrier plate and forming a joint between the carrier plate and the manifold.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

Figure 1:
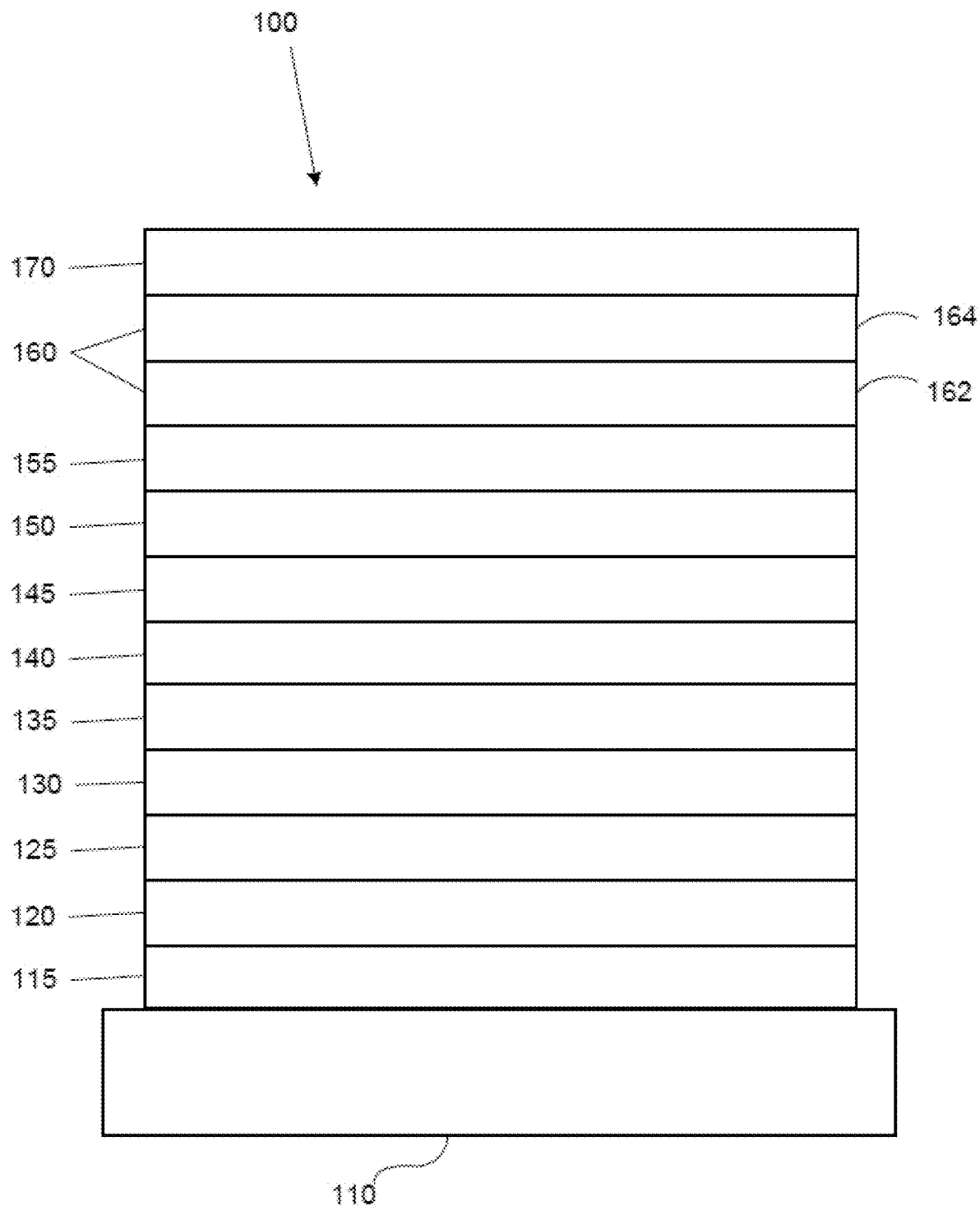
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
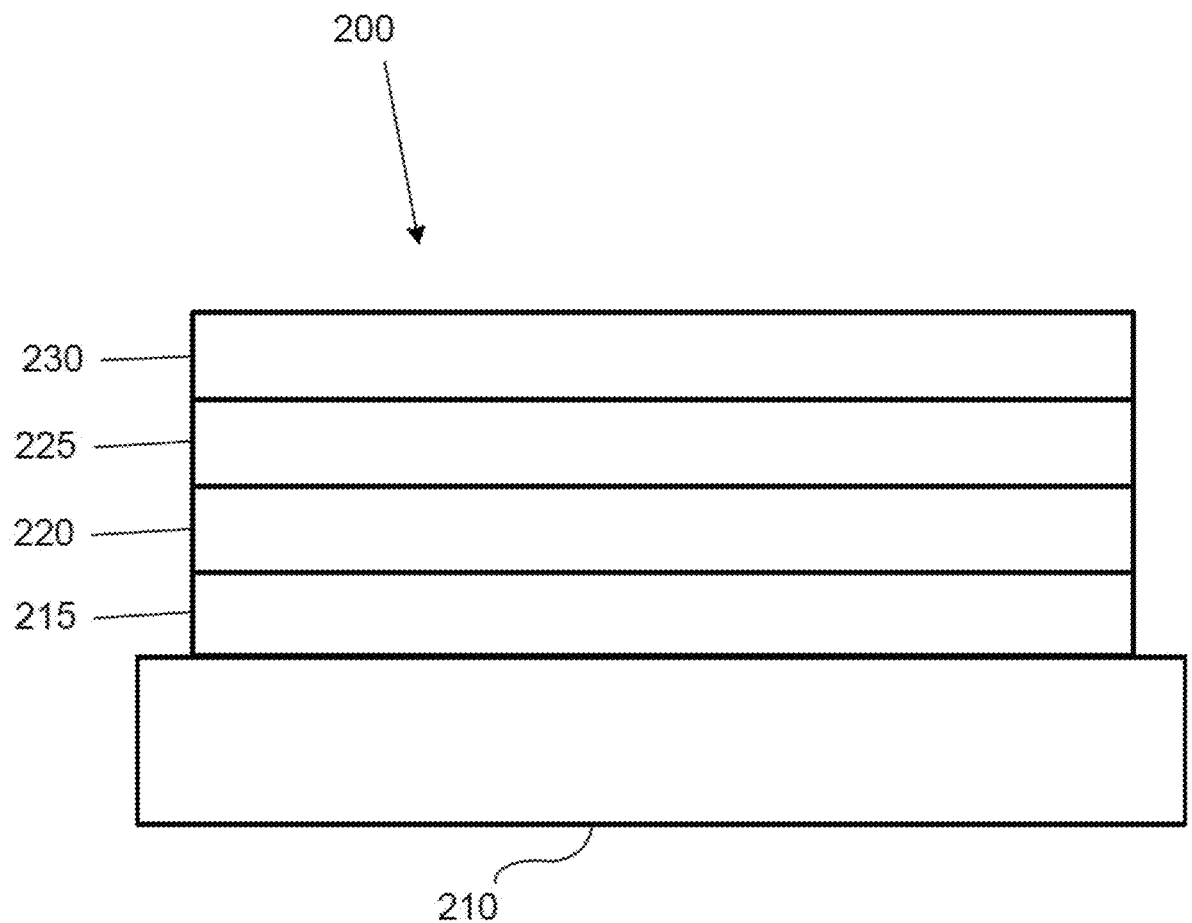
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include flat panel displays, computer monitors, medical monitors, televisions, billboards, lights for interior or exterior illumination and/or signaling, heads-up displays, fully or partially transparent displays, flexible displays, laser printers, telephones, mobile phones, tablets, phablets, personal digital assistants (PDAs), wearable devices, laptop computers, digital cameras, camcorders, viewfinders, micro-displays (displays that are less than 2 inches diagonal), 3-D displays, virtual reality or augmented reality displays, vehicles, video walls comprising multiple displays tiled together, theater or stadium screen, and a sign. Various control mechanisms may be used to control devices fabricated in accordance with the present invention, including passive matrix and active matrix. Many of the devices are intended for use in a temperature range comfortable to humans, such as 18 C to 30 C, and more preferably at room temperature (20-25 C), but could be used outside this temperature range, for example, from −40 C to 80 C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

In some embodiments, the OLED has one or more characteristics selected from the group consisting of being flexible, being rollable, being foldable, being stretchable, and being curved. In some embodiments, the OLED is transparent or semi-transparent. In some embodiments, the OLED further comprises a layer comprising carbon nanotubes.

In some embodiments, the OLED further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

In some embodiments of the emissive region, the emissive region further comprises a host.

In some embodiments, the compound can be an emissive dopant. In some embodiments, the compound can produce emissions via phosphorescence, fluorescence, thermally activated delayed fluorescence, i.e., TADF (also referred to as E-type delayed fluorescence), triplet-triplet annihilation, or combinations of these processes.

The OLED disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

The organic layer can also include a host. In some embodiments, two or more hosts are preferred. In some embodiments, the hosts used maybe a) bipolar, b) electron transporting, c) hole transporting or d) wide band gap materials that play little role in charge transport. In some embodiments, the host can include a metal complex. The host can be an inorganic compound.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

Various materials may be used for the various emissive and non-emissive layers and arrangements disclosed herein. Examples of suitable materials are disclosed in U.S. Patent Application Publication No. 2017/0229663, which is incorporated by reference in its entirety.

Conductivity Dopants:

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

HiI/HtI:

A hole injecting/transporting material to be used in the present invention is not particularly limited, and any compound may be used as long as the compound is typically used as a hole injecting/transporting material.

Ebl:

An electron blocking layer (EBL) may be used to reduce the number of electrons and/or excitons that leave the emissive layer. The presence of such a blocking layer in a device may result in substantially higher efficiencies, and or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and or higher triplet energy than one or more of the hosts closest to the EBL interface. In one aspect, the compound used in EBL contains the same molecule or the same functional groups used as one of the hosts described below.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

Hbl:

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and or higher triplet energy than the emitter closest to the HBL interface. In some embodiments, the HBL material has a lower HOMO (further from the vacuum level) and or higher triplet energy than one or more of the hosts closest to the HBL interface.

Etl:

An electron transport layer (ETL) may include a material capable of transporting electrons. The electron transport layer may be intrinsic (undoped), or doped. Doping may be used to enhance conductivity. Examples of the ETL material are not particularly limited, and any metal complexes or organic compounds may be used as long as they are typically used to transport electrons.

Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

Embodiments of the disclosed subject matter provide architectures for depositors in an OVJP (organic vapor jet printing) tool that utilizes the DEC (delivery, exhaust, confinement) method to control the shape of printed features. Delivery and exhaust apertures may be in the plane of the die rather than on its edge. Many of the limitations of an edge-on micronozzle array may be from a fabrication process that may not define apertures directly by photolithography. An in-plane micronozzle array system may be fabricated by a process in which apertures are defined directly by photolithography to meet submicron shape tolerances. Additionally, an in-plane print head may have channels abutting the delivery and exhaust apertures that may be relatively short to maintain uniform flow resistance.

An in-plane print head may provide a higher linear density of depositors, and may allow for apertures to be fabricated to higher tolerances and in more complex designs. The delivery and exhaust channels may be disposed orthogonally to each other to both supply process gas to and withdraw it from the close-coupled microstructures of each depositor. Embodiments of the disclosed subject matter also provide methods for fabricating arrays of these depositors and packaging them for use.

Figure 3A:
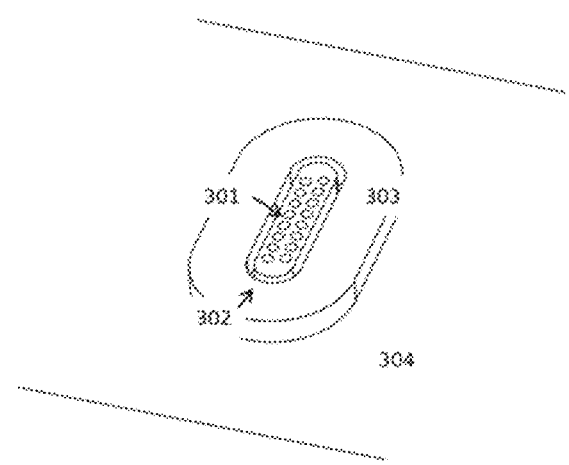
FIG. 3A shows a depositor on an in-plane micronozzle array die according to an embodiment of the disclosed subject matter.

FIG. 3A shows a depositor on an in-plane micronozzle array die according to an embodiment of the disclosed subject matter. The in-plane depositor includes an array of delivery apertures 301 surrounded by one or more exhaust apertures 302. A single oval exhaust aperture may be used. The single oval exhaust may be formed using a SOI dissolved wafer process disclosed herein. The delivery and exhaust apertures may be enclosed within the perimeter of a boss 303 that protrudes from the substrate facing side 304 of the micronozzle array.

Figure 3B:
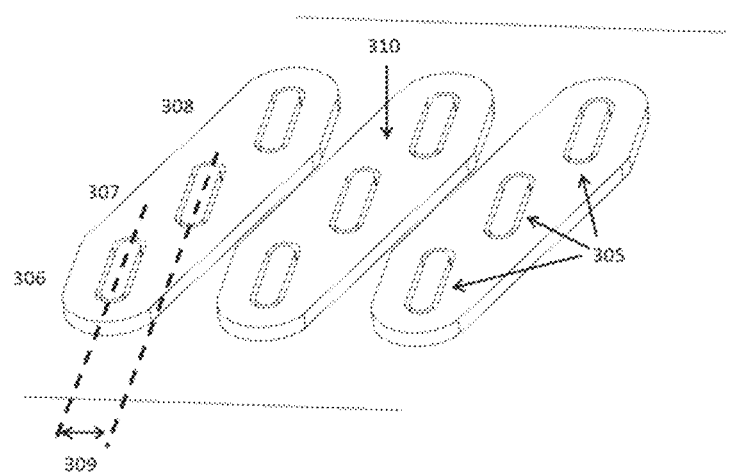
FIG. 3B shows a multi-depositor bank on an in-plane micronozzle array die according to an embodiment of the disclosed subject matter.

A plurality of depositors 305 may be arranged in an array as shown in FIG. 3B. Routing of the delivery and exhaust channels to service each depositor 305 may have a greater width than the desired pitch of printed features. Depositors 305 may be arranged in a plurality of ranks to print at a finer pitch. Although first 306, second 307, and third 308 ranks are shown in FIG. 3B, there may be greater or fewer ranks of depositors. The printing pitch may be defined by the shortest distance 309 orthogonal to the print direction between the centers of two depositors 305. Each depositor 305 may be on its own boss or a plurality of depositors may be arranged on common bosses 310, as shown in FIG. 3B.

The delivery and exhaust apertures may both be etched into a thin membrane. This creates the challenge of addressing two sets of apertures distributed over the membrane with two sets of channels behind the membrane. This may be solved by routing the delivery and exhaust channels orthogonally to each other. The exhaust channels may be in the plane of the micronozzle array, while delivery channels may be enclosed within pillars normal to the plane of the micronozzle array that extend through the exhaust channel layer.

Figure 4:
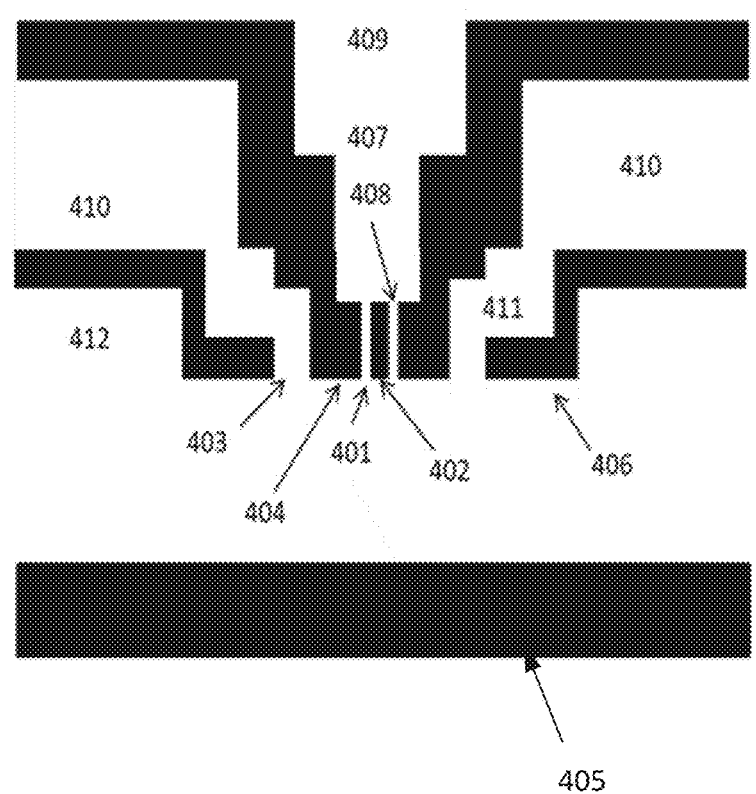
FIG. 4 shows an internal cross section of a depositor on an in-plane micronozzle array die according to an embodiment of the disclosed subject matter.

FIG. 4 shows an internal cross section of a depositor on an in-plane micronozzle array die according to an embodiment of the disclosed subject matter. Delivery apertures 401 may permit jets of delivery gas to pass through a membrane 402 that forms the lower surface of the depositor. An oval exhaust aperture 403 may be cut into the membrane 402 to remove surplus vapor from a delivery zone. The region of membrane 402 between the delivery and exhaust apertures 404 may serve a function analogous to the DE spacers in edge-on embodiments of DEC OVJP. The region of membrane 402 between the delivery and exhaust apertures 404 may provide a confined flow path between a delivery aperture and its closest exhaust aperture that brings the delivery jet into close contact with the substrate 405. A ring 406 of the membrane surrounding the exhaust aperture 403 may function similarly to the EC spacer described throughout, where the EC spacer may be a distance between an exhaust aperture and a confinement aperture. The ring 406 of the membrane may collimate the flow of confinement gas to better block the spreading of delivery gas beyond the exhaust aperture.

Delivery gas may be provided to the delivery aperture 401 through a delivery channel 407. Its narrowest portion may include a plurality of sub-channels 408 through the membrane 402 that each feed a different delivery aperture 401. At the opposite end of the delivery channel 407 may be a delivery via 409 into which delivery gas for the depositor is fed. The confined geometry at the downstream end of the channel may have small features, while larger features may provide for a low-impedance flow path. The delivery channel 407 may begin wide, and may narrow based on the amount of space available. Process gas drawn through the exhaust apertures 403 may leave through the exhaust channels 410. Like the delivery channel 407, the exhaust channel 410 may be narrow near the apertures 403 and wider further from them. The wide portion of the exhaust channel 410 connects to exhaust vias (not shown). The wide portion of the exhaust channel 410 may connect to the exhaust aperture 403 through a dogleg 411. Confinement gas may be distributed between depositors through recesses 412 etched into the underside of the micronozzle array between the depositor bosses.

Figure 5A:
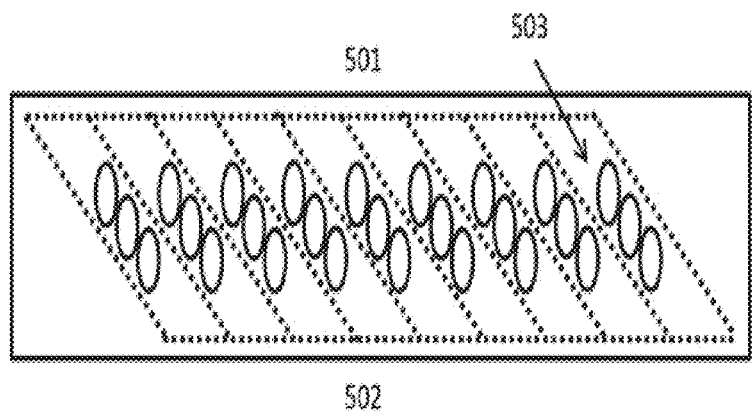
FIG. 5A shows an exhaust channel layout of from the depositor side of an in-plane micronozzle array die according to an embodiment of the disclosed subject matter.
Figure 5B:
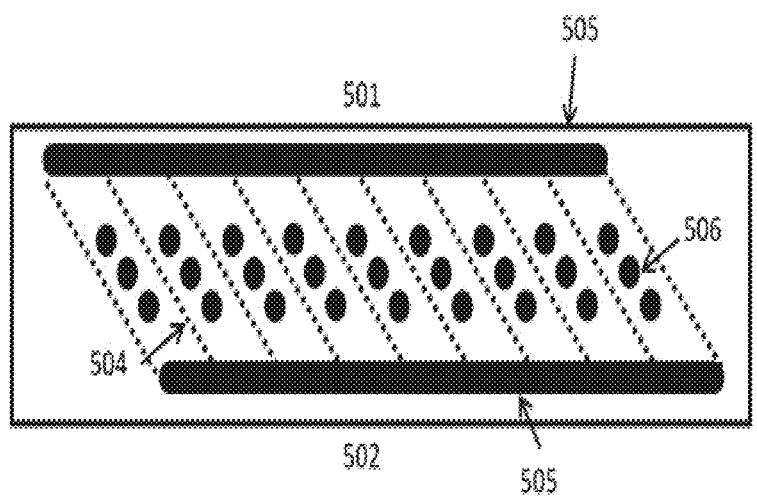
FIG. 5B shows the exhaust channel layout from the via side of an in-plane micronozzle array die according to an embodiment of the disclosed subject matter.

FIG. 5A shows an exhaust channel layout of from the depositor side of an in-plane micronozzle array die, and FIG. 5B shows the exhaust channel layout from the via side of an in-plane micronozzle array die according to embodiments of the disclosed subject matter.

That is, FIG. 5A shows the underside, as seen from the substrate, and FIG. 5B shows the vias that connect to a delivery gas source and an exhaust sink. Exhaust channels may extend between the front 501 and rear 502 of the array. Exhaust channels may run behind the depositors and may be sufficiently wide to evenly provide exhaust extraction. Typically, the depositors 503 may sit within the in-plane extent of an exhaust channel. The exhaust channels may be separated by solid walls, or they may form a continuous cavity supported by discontinuous walls made form solid pillars. The walls between channels may be represented by dashed lines 504. Exhaust channels may be parallel to the print direction, or they may be angled (as shown in FIG. 5B) to accommodate multiple ranks of depositors. Exhaust channels may extend between exhaust vias 505 located near the front and rear edges 501, 502 of the micronozzle array. Withdrawing exhaust from both ends of the channel may improve both exhaust conductance and the uniformity of exhaust service to depositors on a common exhaust channel. Delivery vias 506 may correspond to depositors 503 on the opposite side. Delivery channels may extend downward from every delivery via and may orthogonally cross the exhaust aperture to connect to the depositor. Delivery vias may be arranged individually or in ranked clusters (as shown in FIG. 5A), depending on the depositor arrangement.

The arrangement presented in FIGS. 3A-5B may be a preferred embodiment, although alternate configurations may be possible, so long as the exhaust aperture is in a position to capture all of the streamlines of gas flow emitted from the delivery apertures under operational condition. Round apertures may improve material utilization efficiency relative to slit nozzles. The jet from a round aperture may diverge in all directions in the substrate plane when it impinges on the substrate. This may bring a greater fraction of organic vapor laden gas from the jet into contact with the substrate. The jet from a slit nozzle may diverge in directions orthonormal to the substrate normal and the major axis of the slit. Depositors may typically be much longer than they are wide. A long array of delivery apertures may present a narrow section perpendicular to the direction of printing while maximizing the delivery aperture area over printing zones. This optimizes printing speed without increasing feature size.

Figure 6:
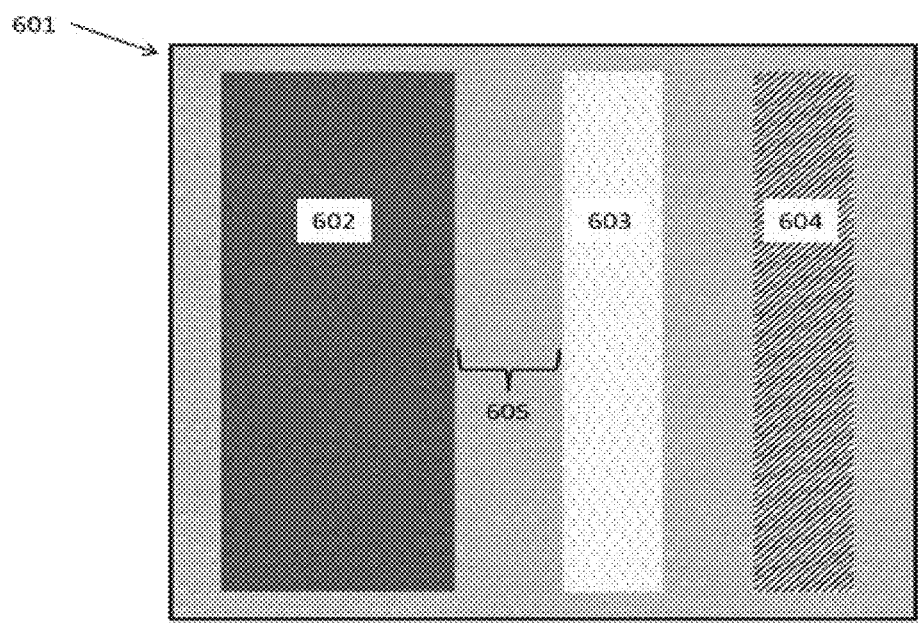
FIG. 6 shows an embodiment of an RGB pixel design compatible with OVJP according to an embodiment of the disclosed subject matter.

FIG. 6 shows an embodiment of an RGB pixel design compatible with OVJP according to an embodiment of the disclosed subject matter. The pixel 601 may include three separate electrodes that define the active area of blue 602, green 603, and red 604 subpixels. The subpixels may be separated by a margin 605 that is masked with an insulating grid material. A thin film feature deposited by OVJP may have uniform thickness within the active area of a subpixel and it may not extend into the active area of a neighboring subpixel. Printed features may be no wider than the subpixel width plus two times the margin width, less positioning tolerances. A typical pixel in an 8K display may have feature sizes of less than 110 µm for blue pixels and 85 µm for red and green pixels. The region of controlled thickness uniformity may be the width of the subpixel plus positioning tolerances, and uniformity may be greater than 95% to print a useful subpixel. The uniformity over width w may be defined in eq. 1 below. The uniform region may be typically at least 50 µm wide for blue subpixels and 25 µm wide for red and green subpixels.

$$U_w = \frac{\max\left(\frac{-w}{2}, \frac{w}{2}\right) - \min\left(\frac{-w}{2}, \frac{w}{2}\right)}{avg\left(\frac{-w}{2}, \frac{w}{2}\right)} \quad (1)$$

Figure 7A:
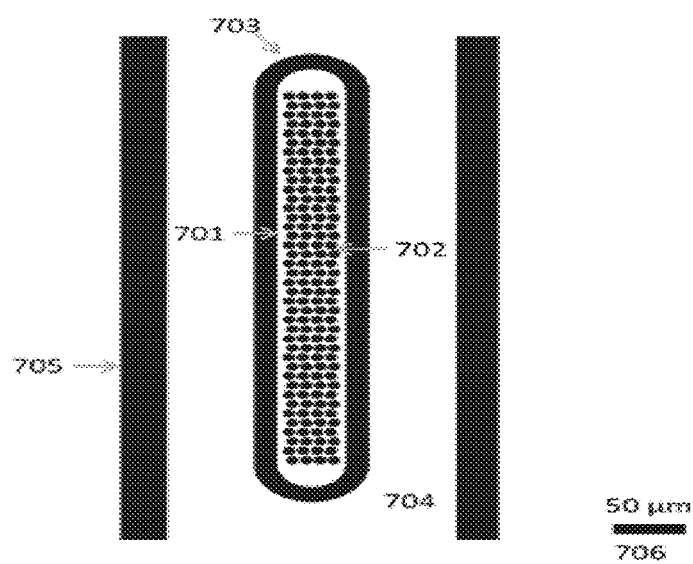
FIG. 7A shows a delivery and exhaust aperture configuration of a depositor to print devices with a 25 µm wide active area according to an embodiment of the disclosed subject matter.
Figure 7B:
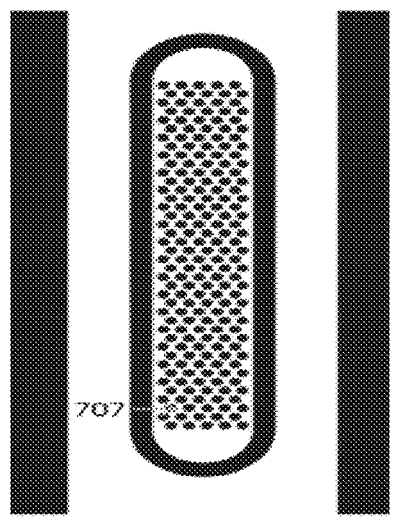
FIG. 7B shows a delivery and exhaust aperture configuration of a depositor to print devices with a 50 µm wide active area according to an embodiment of the disclosed subject matter.

Two variations of this depositor type are show in FIGS. 7A-7B. FIG. 7A shows a delivery and exhaust aperture configuration of a depositor to print devices with a 25 µm wide active area according to an embodiment of the disclosed subject matter. The depositor of FIG. 7A may be configured to print red and green devices. The circular delivery apertures 701 may be arranged in rows of four orthogonal to the print direction. As shown in the example of FIG. 7A, spacing between apertures may equidistant, but the row is shifted slightly to one side. The adjacent rows 702 may be a mirror image, shifted to the other side. The lateral dithering of apertures created by mirroring may distribute delivery jets more evenly over the printing zone. The lateral dithering of apertures may also permit apertures to be packed more densely. A single elliptical exhaust aperture 703 may surrounds the array of delivery apertures. The delivery and exhaust apertures may sit on a raised boss 704, which may be surrounded by recesses 705 to permit the free flow of confinement gas between depositors.

A scale bar 706 indicates a width of 50 µm. FIG. 7B shows a delivery and exhaust aperture configuration of a depositor to print devices with a 50 µm wide active area according to an embodiment of the disclosed subject matter. The wider depositor of FIG. 7B may be configured to print the blue devices. The delivery apertures may be arranged in wider rows of five 707, but the design is otherwise similar to that shown in FIG. 7A. A plurality of delivery apertures may be preferable to fewer delivery apertures for uniformity and sidewall sharpness, while wider apertures may improve utilization efficiency. The aperture density may be balanced against the size of individual apertures.

Figure 8A:
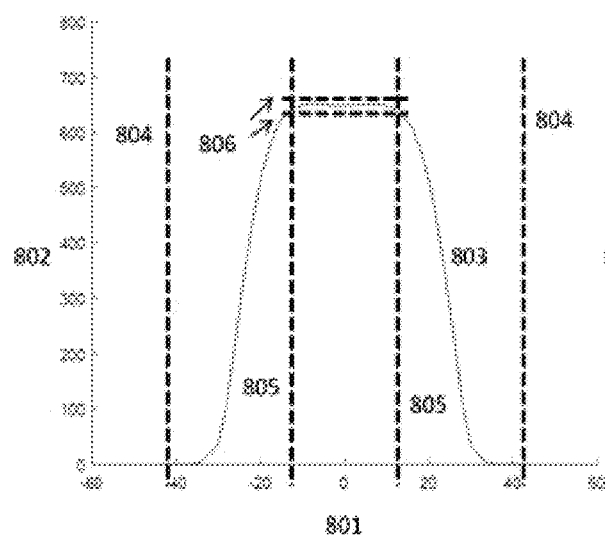
FIG. 8A shows a thickness cross section of a line printed by a depositor to print devices with a 25 µm wide active area according to an embodiment of the disclosed subject matter.
Figure 8B:
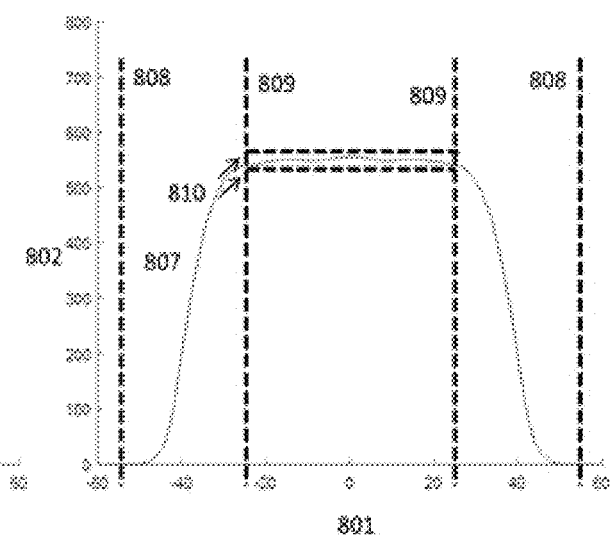
FIG. 8B shows a thickness cross section of a line printed by a depositor optimized to print devices with a 50 µm wide active area according to an embodiment of the disclosed subject matter.

The deposition thickness profiles of features printed by the depositors in FIGS. 7A-7B are plotted in FIGS. 8A-8B, where FIG. 8A shows a thickness cross section of a line printed by a depositor to print devices with a 25 µm wide active area, and FIG. 8B shows a thickness cross section of a line printed by a depositor optimized to print devices with a 50 µm wide active area according to embodiments of the disclosed subject matter. The horizontal axis 801 shown in FIGS. 8A-8B may give distance from the center of the depositor orthogonal to the direction of printing in microns. The vertical axis 802 shown in FIGS. 8A-8B may indicate thickness in arbitrary units.

The plotted curve 803 in FIG. 8A may indicate the cross sectional thickness profile of the feature printed by the depositor in FIG. 6A. The outermost vertical lines 804 shown in FIG. 8A indicate a total allowed width of the printed feature. The profile of the feature may not extend beyond lines 804. The feature width may be under specification, with FW5M=60.8 µm. The inner vertical lines 805 may indicate the 25 µm width over which uniformity may be controlled. This may correspond to the width of the active area of the printed device. The pair of horizontal lines 806 may indicate the maximum and minimum thickness for this region. The profile may lie within the rectangle formed by the horizontal lines 806 and inner vertical lines 805, indicating that thickness uniformity is within specification. In this case, $U_{25}=98.4\%$ when $w=25$ in equation (1) above.

The plotted curve 807 in FIG. 8B may indicate the cross sectional thickness profile of the feature printed by the depositor in FIG. 6B. This feature may be allowed to be wider that the feature of FIG. 6A. The outer vertical lines 808 may indicate the maximum allowed feature width of 110 µm. The actual FW5M=90.0 µm may be inside of the feature width specification. The inner vertical lines 809 may indicate the 50 µm width over which uniformity is controlled. The area bounded by the horizontal lines 810 and inner vertical lines 809 may represent a window for 95% thickness uniformity. It may enclose the profile, and $U_{50}=97.1\%$ when $w=50$ in equation (1) above.

Figure 9A:
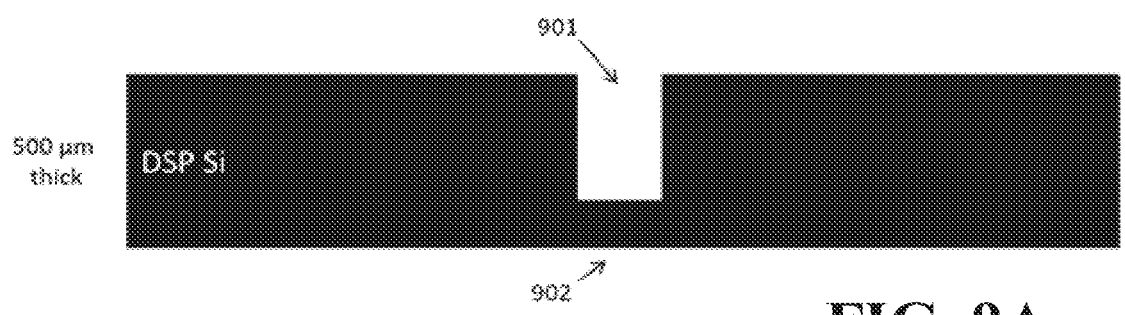
FIGS. 9A-9B show operations for etching channels and vias into a double side polished Si wafer used to assemble micronozzle arrays according to embodiments of the disclosed subject matter.
Figure 9B:
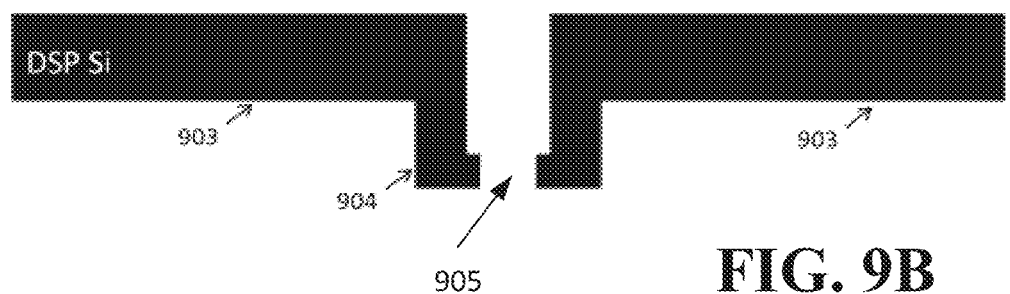

An embodiment of an in-plane print head may be fabricated by the following process. Other processes may be possible to produce similar structures and processing of this structure may vary considerably from the process flow presented. FIGS. 9A-9B show operations for etching channels and vias into a double side polished Si wafer used to assemble micronozzle arrays according to embodiments of the disclosed subject matter.

The upper portion of the micronozzle array may be formed from a double side polished (DSP) Si wafer of approximately 500 µm in thickness. Its top surface may be covered with a photolithographically patterned mask. Blind holes may be etched into the wafer face with deep reactive ion etching (DRIE). FIG. 9A shows the wafer after the top surface of the wafer is etched. The etchings may form the delivery vias 901 and delivery channels of the micronozzle array. The upstream portion of the delivery channel may be wider than the downstream portion to reduce the impedance to delivery flow. This may be achieved using a nested mask and a two stage etch. The total etch depth may be 400-450 µm. A Si membrane 902 may be disposed between the floor of the etching and the underside of the wafer.

The opposite side of the wafer may be etched to the configuration shown in FIG. 9B. A nested mask on the lower surface of the wafer may be patterned with photolithography. The etching may be performed in two stages. The lower surface may be first etched to a depth of 200-300 µm to define the exhaust channels 903 and internal pillars 904 of the micronozzle array. Each pillar may surround a delivery channel and may separate it from the surrounding exhaust channel. The pillars may have an elliptical cross section. The second stage of the etch may open the Si membrane over the face of the pillar to create a through hole 905 for the delivery channel.

Figure 10A:
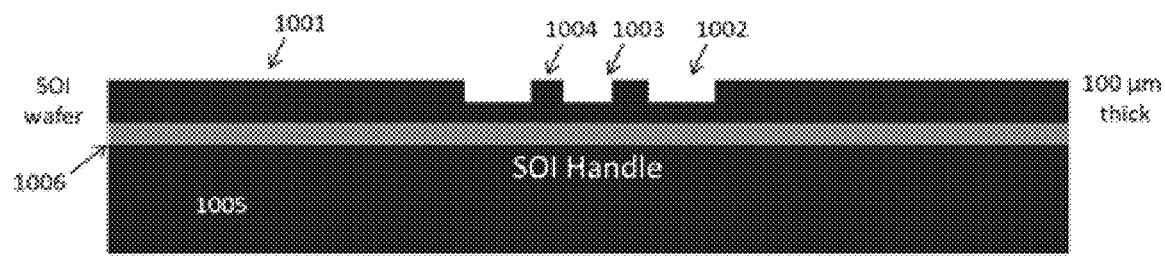
FIGS. 10A-10C show operations for etching a SOI wafer, bonding it to a DSP wafer, and completing the micronozzle arrays according to embodiments of the disclosed subject matter.
Figure 10B:
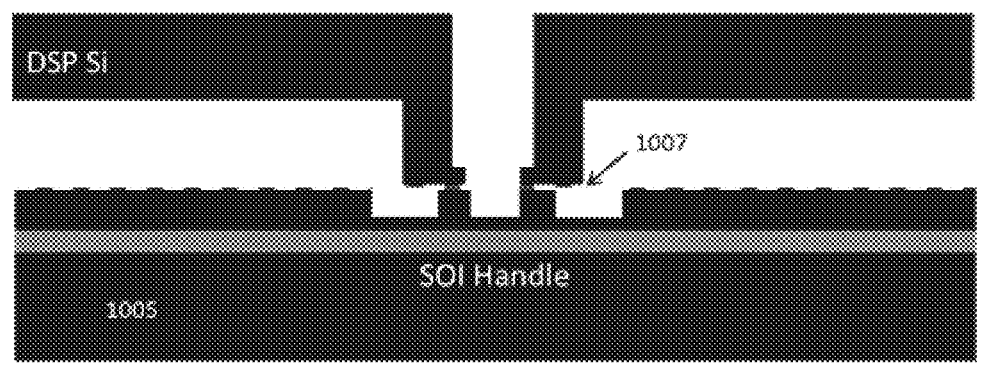
Figure 10C:
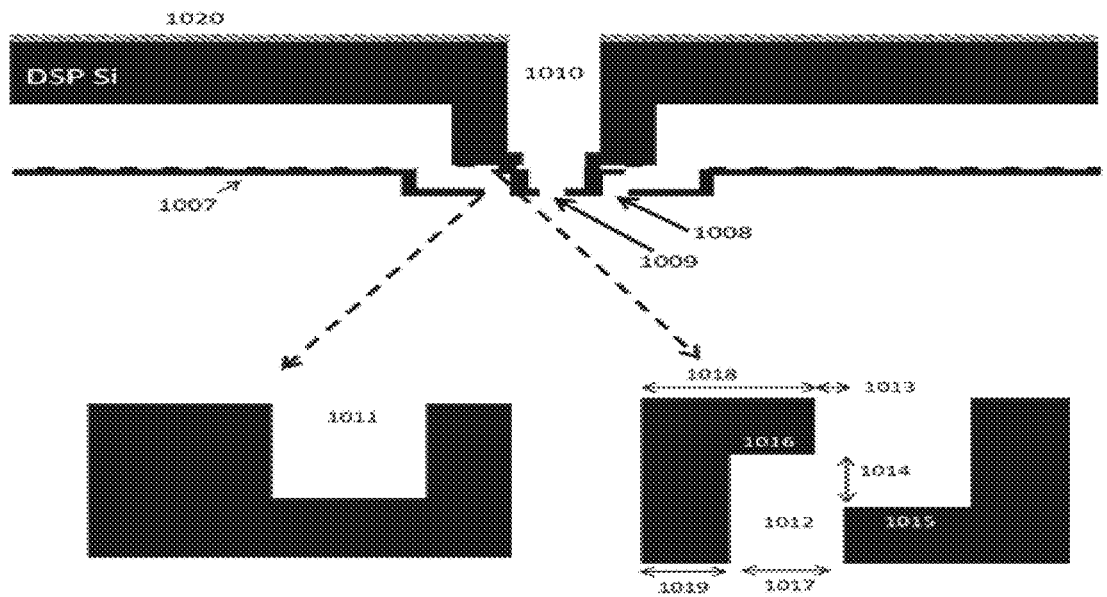

FIGS. 10A-10C show operations for etching a SOI wafer, bonding it to a DSP wafer, and completing the micronozzle arrays according to embodiments of the disclosed subject matter. The lower portion of the micronozzle array may be defined in a SOI wafer with a relatively thick device layer 1001 of 100 µm as shown in FIG. 10A. A SOI wafer may permit thin and/or delicate structures to be fabricated in the device layer 1001 prior to bonding. The device layer 1001 may be masked and patterned with photolithography. The device layer 1001 may be etched through approximately two thirds of its thickness with DRIE to form an elliptical trench 1002 that will become part of the exhaust channel. A central rectangular trench 1003 produced in the same step may become part of the delivery channel 1001. The elliptical and rectangular trenches may be separated by an elliptical ridge 1004 that corresponds to the pillar on the DSP wafer. This ridge 1004 may bond to the pillar and seal the delivery and exhaust channels from each other when the two wafers are bonded. A handle layer 1005 may be joined to the device layer 1001 by an oxide layer 1006. The handle layer 1005 may provide mechanical support for the device layer 1001 during processing.

The DSP and SOI wafers may be bonded as shown in FIG. 10B. The joint 1007 may connect the faces of the pillars on the DSP wafer bond to the ridges on the SOI wafers. This may form a seal that separates the delivery and exhaust channels into distinct flow paths. Walls between etched exhaust channel trenches on the DSP wafer (not shown) may bond to the face of the SOI wafer. The handle layer 1005 may be removed to yield the structure in FIG. 10C. A nested etch mask may be patterned on the underside of the device layer using photolithography. The buried oxide layer may comprise part of the nested mask.

The underside of the wafer may be etched in two steps. The first, deeper etch may be used to define both the raised regions 1007 on the underside of the micronozzle array and the exhaust apertures 1008. The second etch may define and opens the delivery apertures 1009 by removing portions of the Si membrane covering the central trench 1003 leading to the delivery channel 1010. The delivery apertures 1009 may be defined by direct photolithographic patterning followed by etching through a shallow membrane. This may permit the delivery apertures 1009 and distal portions of the delivery channels 1010 to be fabricated to very tight tolerances and may ensure a uniform array.

The exhaust aperture 1008 may connect to the exhaust channel through a dogleg structure illustrated in the inset. The dogleg exhaust channel extends through the device layer membrane. The upper portion 1011 of the dogleg may be formed by the elliptical trench 1002 etched in the first etch step on the SOI wafer. The lower portion 1012 of the dogleg may be formed by the nested etch on the underside of the SOI device layer 1001. The unmasked regions of the two etches partially overlap in the plane of the wafer. The width 1013 of this region of overlap is illustrated in the inset of FIG. 10C. Each etched region overlaps the other for a small portion of its area. The upper and lower trenches may connect to form a channel through the membrane when etched. The height of the overlap 1014 where the trenches are open to each other may extend from the floor of the elliptical trench 1015 in the SOI face to the floor 1016 of the exhaust aperture trench etched into the underside of the device layer. The exhaust aperture width 1017 may be defined directly by photolithography. The performance of a depositor may be less dependent on the internal dimensions of the dogleg. The dogleg structure may provide a sufficiently wide bonding surface 1018 on the ridge for the pillar on the DSP wafer in cases where the spacing 1019 between delivery and exhaust apertures may be very small. Small delivery to exhaust aperture spacing may be used to print fine features.

After etching is complete, the exposed DSP wafer face may be metallized to facilitate soldering to a carrier plate. The film stack 1020 may include an adhesion layer, a diffusion blocking layer, and a capping layer. Titanium, platinum, and gold may work well in these respective applications. The micronozzle arrays may be separated by dicing the wafer. Each of the resulting dies may include a micronozzle array.

Figure 11A:
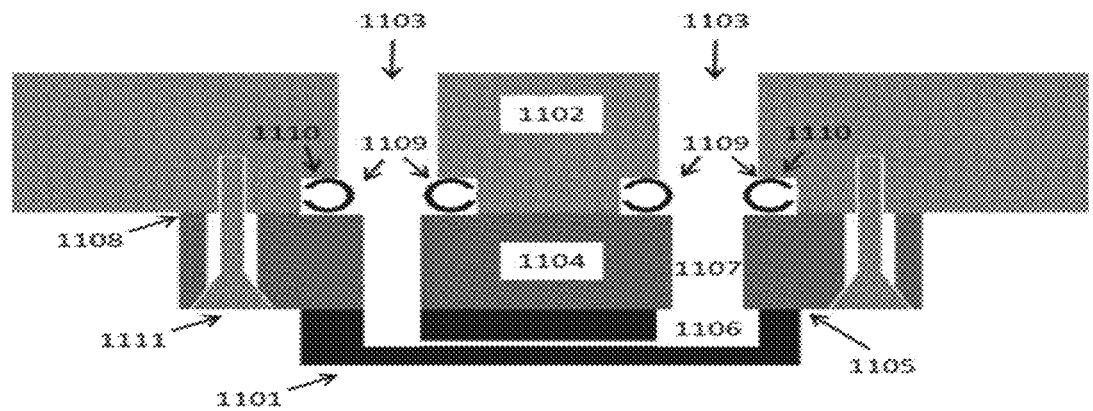
FIG. 11A shows the attachment of a die containing a micronozzle array to a process gas manifold through a carrier plate according to an embodiment of the disclosed subject matter.

FIG. 11A shows the attachment of a die containing a micronozzle array to a process gas manifold through a carrier plate according to an embodiment of the disclosed subject matter. The micronozzle array 1101 may form a gas-tight seal with a manifold 1102 within the deposition chamber of the OVJP tool. The manifold 1102 may provide the micronozzle array with a feed of heated delivery gas including organic vapor, and may withdraw a stream of exhaust gasses from the exhaust channels. Process gasses may be transported by runlines 1103 within the manifold 1102. The configuration of the die and manifold system is shown in FIG. 11A. The die may be attached to a carrier plate 1104 to facilitate attachment to the manifold. The die and carrier plate 1104 may be soldered or brazed together in a preferred embodiment. Other die attach methods like anodic bonding or diffusion welding may be used. The attachment operation may form a permanent joint 1105 between the DSP wafer side of a die and a face of the carrier plate 1104. The delivery and exhaust vias 1106 on the die may match to ports 1107 on the carrier plate 1104. The joint 1105 may form a gas tight seal around these ports and vias. A second joint 1108 may seal the carrier plate to the manifold. It may be possible to disassemble the second joint 1108 for maintenance operations on the print head. The die and carrier plate 1104 may form a replicable component of the print head, while the manifold 1102 may be a permanent component. A gasket 1109, such as a metal c-ring, may seal the joint between the die and carrier plate 1104. The die may not be sealed directly to the manifold 1102, since a metal carrier plate 1104 may provide sufficient pressure on the gaskets 1109. The glands 1110 to seat the gaskets 1109 may be milled into the manifold 1102 to simply the carrier plate 1104. Pressure for the metal gasket seal between the carrier plate 1104 and the manifold 1102 may be provided by bolts 1111.

The carrier plate 1104 may be made of metal. Molybdenum may be preferred for braze and/or solder attachment because it matches the coefficient of thermal expansion (CTE) of Si well from room temperature to the reflow temperature of relatively high melting solders like Au/In alloy. The OVJP tool may operate at temperatures of up to 350° C. or more, so CTE may match over a very wide range of temperatures for a reliable bond. The carrier plate 1104 may be milled, ground, lapped, and polished to provide a compatible bonding surface with the micronozzle array 1101 on one side and a metal gasket sealing surface on the other side. The carrier plate 1104 may be electroplated with additional metal layers and capped with gold to improve wetting of the solder. The micronozzle array 1101 and carrier plate 1104 may be aligned and joined at high temperature under pressure. Bonding may be performed in room air or a vacuum, inert, or reducing atmosphere.

Figure 11B:
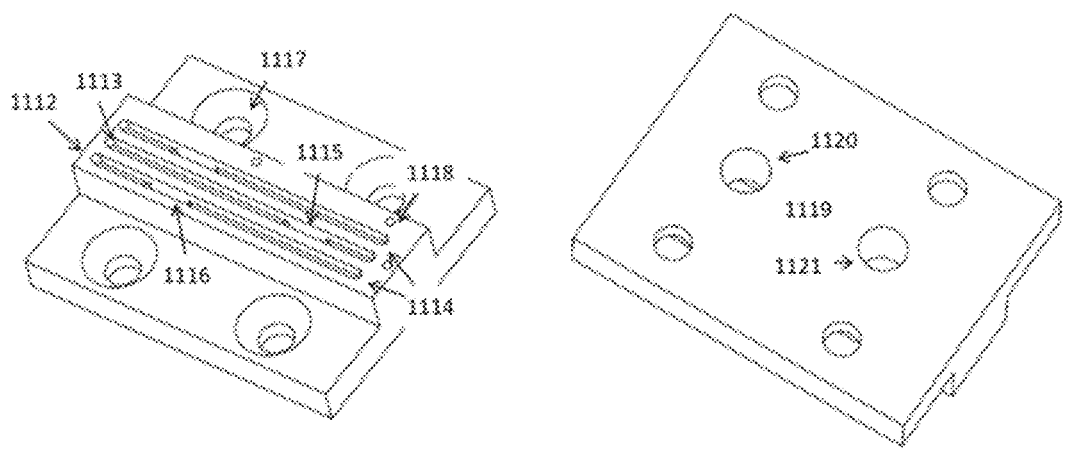
FIG. 11B shows a carrier plate according to an embodiment of the disclosed subject matter.

FIG. 11B shows an embodiment of a carrier plate in top (left) and bottom (right) views. A die including a micronozzle array may be bonded to a raised, finished surface 1112 on the plate. The surface 1112 may be ported with a slot 1113 that covers the surface area containing the delivery vias on the die. This may connect the delivery vias on the die to the delivery gas runline 1103 in the manifold 1102. There may be two exhaust ports 1114, one on each side of the delivery gas port. Shorter, deeper slots connect the delivery 1115 and exhaust 1116 slots to the delivery and exhaust gas ports extending through the carrier plate. The carrier plate 1104 may be bolted to the manifold through four bolt holes 1117. Additional blind holes 1118 may permit the installation of dowel pins to align the die on the polished surface. The reverse side of the carrier plate 1104 may provide a finished sealing surface 1119 for the gaskets 1109 between the carrier plate 1104 and the manifold 1102. One port 1120 on the surface may carry the delivery gas to its slot on the front of the carrier plate 1104. The other port 1121 may draw exhaust gas from its corresponding slots.

Figure 12A:
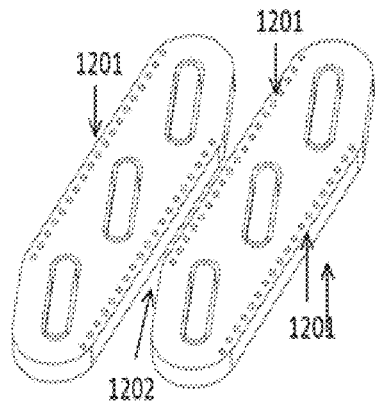
FIG. 12A shows depositors in which confinement gas is fed to the deposition zone through confinement apertures according to an embodiment of the disclosed subject matter.

An embodiment of the in-plane depositor may include confinement apertures with planes parallel to the substrate plane. FIG. 12A shows depositors in which confinement gas is fed to the deposition zone through confinement apertures according to an embodiment of the disclosed subject matter. Confinement apertures 1201 may be positioned on the depositor bosses as shown in FIG. 12A. The confinement apertures 1201 may be arranged in a line along the long edge of each boss. Confinement apertures 1201 may be positioned in the recesses 1202 between bosses in addition to being disposed on the depositor bosses, or instead of being disposed on the depositor bosses. Alternately, the underside of the micronozzle array may be flat if it incorporates sufficient confinement apertures to facilitate uniform confinement flow. Confinement gas may be fed at positive pressure relative to the deposition zone through channels located between the depositors.

Figure 12B:
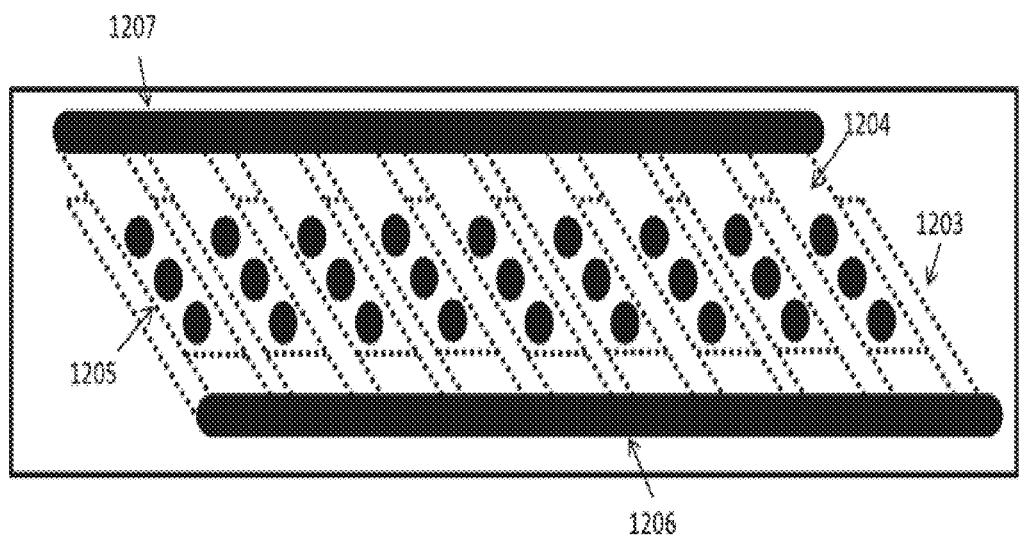
FIG. 12B shows a channel configuration for a micronozzle array in which confinement gas is fed to the deposition zone of each depositor through confinement apertures according to an embodiment of the disclosed subject matter.

FIG. 12B shows a channel configuration for a micronozzle array in which confinement gas is fed to the deposition zone of each depositor through confinement apertures according to an embodiment of the disclosed subject matter. Confinement channels 1203 may be interdigitated with the exhaust channels 1204 as shown in FIG. 12B. The confinement channels 1203 and the exhaust channels 1204 may be separated by vertical sidewalls 1205 that provide structural support for the die while also sealing the confinement and exhaust channel sets from each other. The confinement channels may be fed from a via on one side of the die 1206, while the exhaust channels are connected to a via 1207 on the other side.

Figure 13:
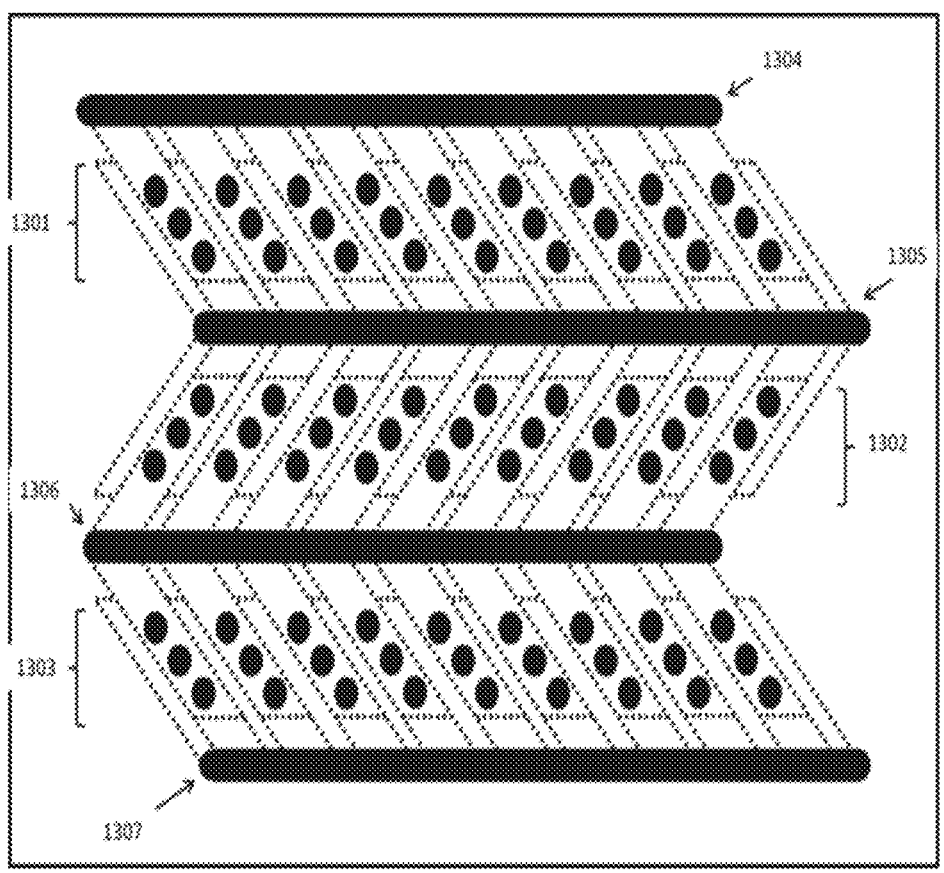
FIG. 13 shows a channel configuration for a micronozzle array having three banks of depositors to permit three colors of EML (emissive layer) to be deposited simultaneously according to an embodiment of the disclosed subject matter.

Another embodiment may include multicolor printing from a single die. FIG. 13 shows a channel configuration for a micronozzle array having three banks of depositors to permit three colors of EML (emissive layer) to be deposited simultaneously according to an embodiment of the disclosed subject matter. Although FIG. 13 shows the use of confinement apertures, some embodiments may not include confinement apertures. Depositors may be are arranged in three distinct banks, such that each bank deposits a different emissive layer composition to produce a different color of OLED. The first bank 1301 may deposit material for a blue EML, while the second bank 1302 may deposit material for a green EML, and the third bank 1303 may deposit material for a red EML. The banks may be offset from each other along the print direction by the subpixel separation appropriate for each color. The correct delivery gas mixture for each bank of depositors is fed to it through its delivery vias.

The interdigitated arrangement of exhaust and confinement channels may be maintained. The exhaust channels servicing the blue depositors may connect to an exhaust via 1304 at the top of the array. Confinement and exhaust vias may address two banks of depositors, one on each side, where possible. Confinement gas may be fed to the blue and green depositor banks through a common via 1305 between the two sets of depositors. Exhaust gasses may be extracted from the red and green depositor banks through a common via 1306 between those two sets of depositors. Confinement gas for the red depositor bank may be fed from a via 1307 on the far side of it.

Experimental

Figure 14:
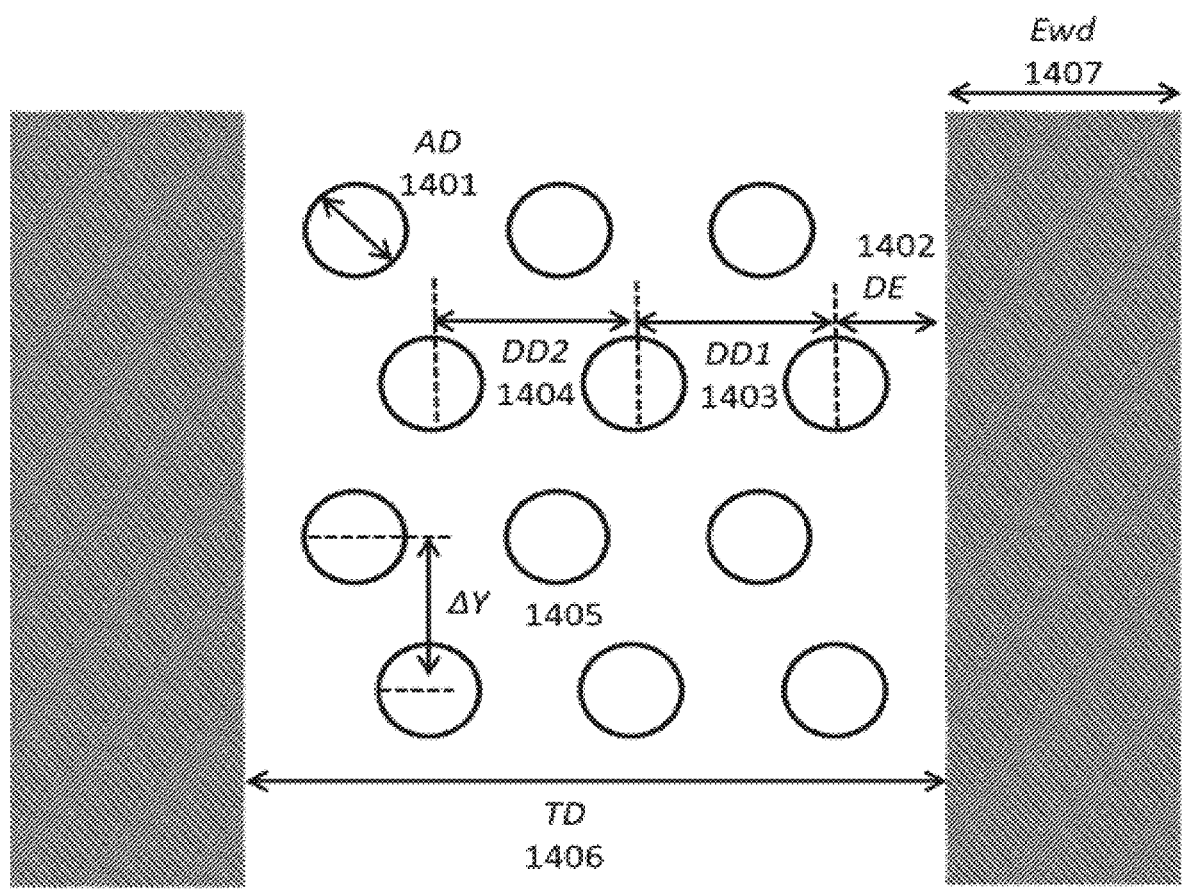
FIG. 14 shows the dimensional arrangement delivery apertures according to an embodiment of the disclosed subject matter.

FIG. 14 shows the dimensional parametrization of the depositors according to an embodiment of the disclosed subject matter. The diameter of the individual delivery apertures may be AD 1401. Delivery apertures in an array may have a different shape or size then those shown in FIG. 14. DE 1402 may be the separation between the exhaust aperture and the center of the closest delivery aperture. This aperture may be considered the outer aperture. Delivery apertures may be arranged in rows orthogonal to the print direction. They may be spaced distance DD center to center. The apertures need not be evenly spaced, as shown in FIG. 14. The distance between the outer aperture and its neighbor may be DD1 1403, the distance between the next neighbor pair may be DD2 1404, and so on. Rows may be separated by distance $\Delta Y$ 1405 along the print direction. Each row may be a mirror image of its neighbors, so that the side on which the outer aperture is distance DE from the nearest exhaust aperture alternates. The total width of the membrane containing the delivery apertures between the inner edges of the exhaust apertures may be TD 1406. Finally, the width of the exhaust aperture may be Ewd 1407. The total length in the print direction of the delivery aperture array may be 400 µm for both depositors. The separation between the membrane containing the delivery apertures and the substrate is given by fly height g.

TABLE 1

Simulated Depositor Dimensions

| Dimension | Red/Green | Blue |
|---|---|---|
| Dwd (µm) | 7.5 | 7.5 |
| DE (µm) | 5 | 5 |
| DD (µm) | 9 | 13 |
| $\Delta Y$ (µm) | 10 | 10 |
| TD (µm) | 56 | 76 |
| Ewd (µm) | 15 | 15 |
| g (µm) | 25 | 25 |

The gas ambient surrounding the depositor is argon at 200 Torr. The depositor may be heated to 600K and the substrate is cooled to 293K. Helium delivery gas may be fed to the depositor at 3 sccm. A helium/argon exhaust mixture is withdrawn at a rate of 14 sccm/depostior. All transport properties are calculated from kinetic theory (see, e.g., Deen et al., *Transport Phenomena*, pp. 14-20). The organic vapor is modeled as a dilute component of the gas mixture with a molecular mass of 500 g/mol and a molecular diameter of 1 nm. Simulations were performed using COMSOL Multiphysics 5.3a finite element modeling software.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. A method of forming a print head, the method comprising:
   forming an upper portion of a micronozzle array on a first side of a double side polished (DSP) silicon wafer;
   covering a first surface of the DSP silicon wafer with a photolithography patterned mask;
   etching blind holes into the first surface of the DSP silicon wafer using deep reactive ion etching (DRIE) to form delivery vias and delivery channels of the micronozzle array;
   etching a second side of the DSP silicon wafer using a nested mask that is patterned with photolithography to form exhaust channels and internal pillars; and
   connecting exhaust apertures to the exhaust channels through a dogleg structure,
   wherein an upper portion of the dogleg is formed by a trench etched on a SOI (silicon-on-insulator) wafer, and a lower portion of the dogleg is formed by the nested etch on the underside of a SOI device layer.

2. The method of claim 1, wherein a lower portion of the micronozzle array is defined in a silicon-on-insulator (SOI) wafer.

3. The method of claim 2, wherein the SOI wafer has a device layer thickness of 100 µm.

4. The method of claim 1, wherein features of a first etch of the nested etch are contained within total features of a second etch of the nested etch.

5. The method of claim 1, wherein the trench etched on the SOI wafer is around one or more delivery apertures.

* * * * *